United States Patent [19]

Kuhn

[11] 4,320,315

[45] Mar. 16, 1982

[54] FAIL-SAFE AND GATE CIRCUIT

[75] Inventor: John J. Kuhn, Allison Park, Pa.

[73] Assignee: American Standard Inc., Swissvale, Pa.

[21] Appl. No.: 31,723

[22] Filed: Apr. 20, 1979

[51] Int. Cl.³ ............... H03K 19/007; H03K 19/082; H03K 19/20

[52] U.S. Cl. .................................. 307/454; 307/510; 331/113 R

[58] Field of Search ............... 307/218, 232, 454, 350, 307/355, 291; 328/94; 331/113 R

[56] References Cited

U.S. PATENT DOCUMENTS 3,264,579  8/1966  Marcus ........................... 331/113 R
3,705,991  12/1972  Hobo ............................... 307/265 X
3,747,014  7/1973  Darrow ........................... 331/113 R
3,995,173  11/1976  Sibley ................................ 307/218

Primary Examiner—John Zazworsky
Attorney, Agent, or Firm—J. B. Sotak

[57] ABSTRACT

A fail-safe AND logic circuit including a free-running multivibrator and a pair of voltage reference networks. The multivibrator includes a pair of common emitter transistor amplifiers. The transistor amplifiers are separately biased and powered by an individual one of a pair of voltage reference networks so that a.c. oscillations are produced by the multivibrator when a separate negative-going pulse coincidentally appears on both of the pairs of voltage reference networks.

9 Claims, 1 Drawing Figure

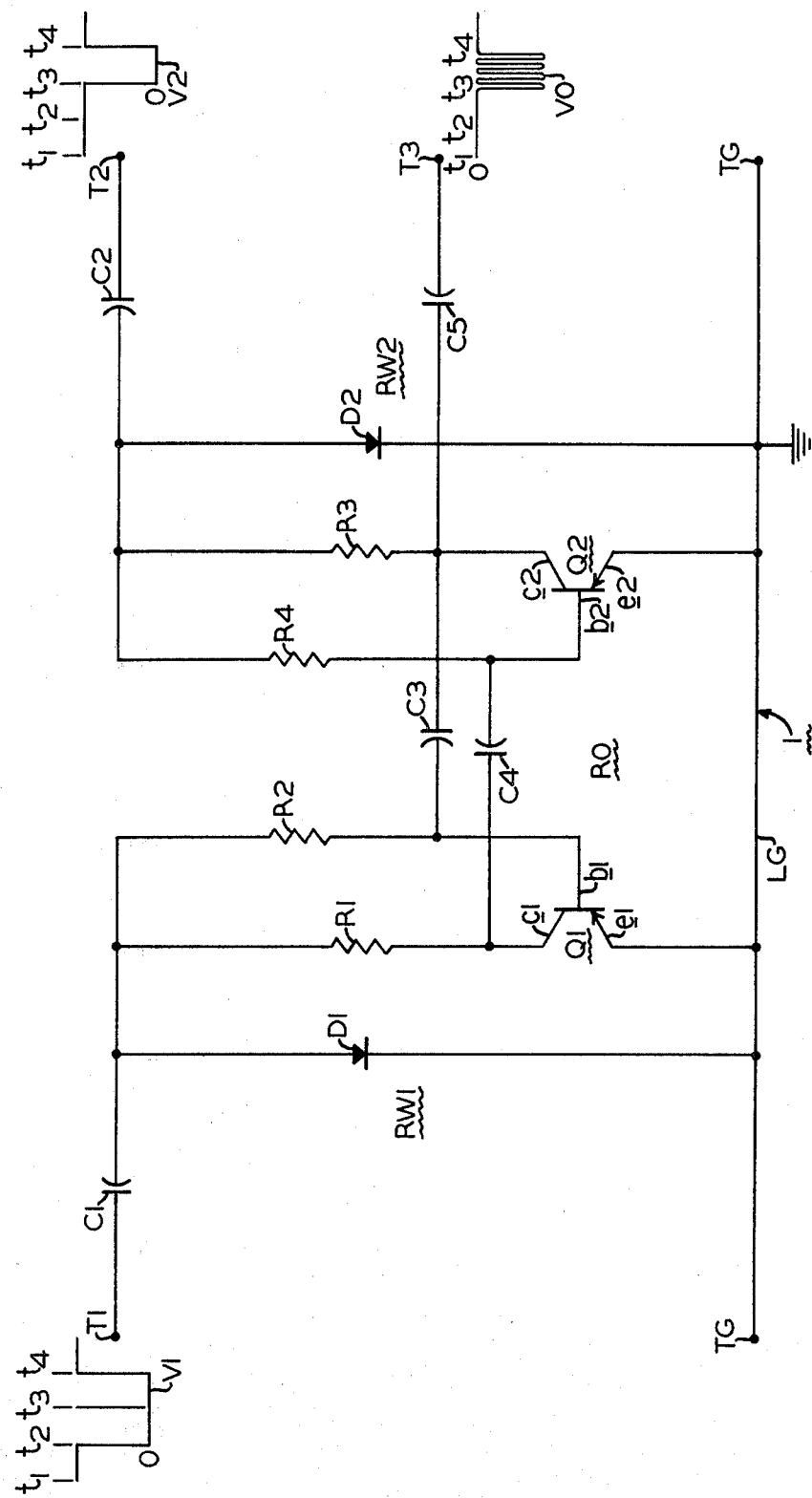

FAIL-SAFE AND GATE CIRCUIT

FIELD OF THE INVENTION

This invention relates to a fail-safe logic circuit and, more particularly, to a vital AND gate employing a relaxation oscillator which requires the presence of a pair of d.c. voltages for producing a.c. oscillations when and only when no circuit component or element fails in an unsafe manner.

BACKGROUND OF THE INVENTION

It is well known that electronic logic circuits, such as, AND gates and the like, are used extensively in computer, communication, control and signaling apparatus. In the present case, the solid-state fail-safe AND circuit is preferably utilized in a vital-type of logic network and may form part of a speed command decoder of an automatic vehicle speed control system. In automatic vehicle speed control systems for railroad and mass and/or rapid transit operations, it is of paramount importance and, in some cases, an authoritative requirement, to ensure that certain critical portions or sections of the system must operate in a fail-safe manner. That is, during an unsafe circuit malfunction or critical component failure, the system must not be capable of exhibiting a less resistive condition. In practice, fail-safe operation may be considered to mean that any conceivable failure will result in a condition at least as restrictive or as safe as that preceding the failure. For example, no conceivable failure in a vehicular speed control system should be capable of issuing a command signal for a higher or increased speed. In most railroad and/or rapid transit speed control systems, it is desirable that a failure should result in a more or most restrictive condition, namely, the stopping of the train or vehicles.

While numerous static AND logic circuit arrangements are well known in the art, only a limited number of AND gating circuits are capable of meeting the above-noted criteria. As a rule, conventional or nonvital semiconductor logic circuits cannot be used in a vital speed control system because of certain shortcomings which result in unsafe operation. For example, the previous ON-OFF or saturation cut-off gate circuits generally produced a zero voltage (OV) or a positive or negative value (+V) or (−V) dependent upon the conductive condition of the solid-state or active elements. It will be appreciated that in such ON-OFF gates, a fully conductive transistor generally cannot be distinguished from a short circuited condition since in each case a saturated current condition exists. In addition, a nonconducting transistor cannot normally be differentiated from an open-circuited element since both resemble a cut-off condition. Obviously, such solid-state AND gates are unacceptable and cannot be tolerated in systems and apparatus which must operate in a fail-safe manner. While a number of attempts have been made to ensure fail-safe operation of these previous nonvital logic circuits, such endeavors usually involved the addition of auxiliary components and elements which materially increased the complexity and intricacy of the basic gating network. Such supplementary devices not only increased overall cost but also decreased the reliability of the logic circuit since any additional element is itself susceptible to failure and malfunction. There are other solid-state gating circuits in existance which utilize a.c. and d.c. input signals for performing an AND function in a vital fashion. However, it is desirable to provide a fail-safe electronic AND gate which is responsive to the presence of a plurality of d.c. inputs to safely produce a modulated output.

OBJECTS OF THE INVENTION

Accordingly, it is an object of this invention to provide a new and improved AND gate which operates in a fail-safe manner.

A further object of this invention is to provide a unique vital electronic logic circuit employing a multivibrator and a pair of voltage supply networks for causing the production of a.c. oscillations when both of the pair of voltage supply networks provide biasing and operating voltages to the multivibrator.

Another object of this invention is to provide a fail-safe solid-state AND gating circuit employing a relaxation oscillator which goes into oscillation during the presence of a pair of voltage pulses.

Yet a further object of this invention is to provide a novel fail-safe AND logic circuit which requires the coincidence of two d.c. input voltages to produce an a.c. output voltage.

Yet another object of our invention is to provide an improved vital-type of electronic logic circuit utilizing an astable transistor multivibrator for producing an a.c. output signal when a pair of d.c. signals provides biasing and operating potentials to the transistor multivibrator.

Still another object of this invention is to provide a fail-safe AND logic circuit comprising a relaxation multivibrator having a first and a second transistor, a first voltage reference network coupled to the first transistor, a second voltage reference network coupled to the second transistor so that the relaxation oscillator produces a.c. oscillations when and only when the first voltage reference network supplies biasing and operating potentials to the first transistor and the second voltage reference network supplies biasing and operating potentials to the second transistor.

Still another object of this invention is to provide a new fail-safe AND gating circuit which is economical in cost, simple in design, reliable in operation, durable in use and efficient in service.

SUMMARY OF THE INVENTION

In accordance with the present invention, the new and improved fail-safe electronic AND logic circuit employs an astable multivibrator. The multivibrator includes a first and a second PNP transistor. Each of the transistors is coupled as a common emitter amplifier. A first and a second voltage reference network supplies biasing and operating voltages to the first and second transistor amplifiers, respectively. The first voltage reference network includes a first coupling capacitor and a first zero voltage reference diode while the second voltage reference network includes a second coupling capacitor and a second zero voltage reference diode. The emitter electrodes of the first and second transistors are coupled in common and are connected to ground or zero reference. The collector electrode of the first transistor is connected to the first voltage reference network via a first load resistor while the base electrode of the first transistor is connected to the first voltage reference network via a first biasing resistor. The collector electrode of the second transistor is connected to the second voltage reference network via a second load resistor while the base electrode of the second transistor is connected to the second voltage reference network via a second biasing resistor. The collector electrode of the first transistor is connected to the base electrode of the second trasistor by a first cross-coupling capacitor while the collector electrode of the second transistor is connected to the base electrode of the first transistor by a second cross-coupling capacitor. A coupling capacitor is connected to the collector electrode of the second transistor for developing a.c. oscillations on an output terminal when a first signal pulse is applied to the first voltage reference network and a second signal pulse is applied to the second voltage reference network.

BRIEF DESCRIPTION OF THE DRAWING

The foregoing objects and other attendant features and advantages will be more readily appreciated as the subject invention becomes better understood by reference to the following detailed description when considered in conjunction with the accompanying drawing wherein:

The single FIGURE is a schematic circuit diagram of a fail-safe electronic AND logic circuit embodying the principles of the present invention.

DETAILED DESCRIPTION OF THE INVENTION

Referring to the single FIGURE of the drawing, there is shown the preferred embodiment of the vital-type of solid-state AND gating circuit of the present invention. As shown, the fail-safe coincident logic circuit generally characterized by numeral 1 is composed of a relaxation oscillating circuit or oscillator RO and a pair of voltage networks RW1 and RW2.

The oscillator RO is an astable or free-running multivibrator which includes a pair of amplifying semiconductive elements in the form of PNP transistors Q1 and Q2. The transistor Q1 includes an emitter electrode e1, collector electrode c1 and a base electrode b1 while the transistor Q2 includes an emitter electrode e2, a collector electrode c2 and a base electrode b2. As shown, the emitter electrodes e1-e2 are connected in common to ground lead LG.

It will be seen that the collector electrode c1 is connected to the first voltage reference or supply network RW1 via a load resistor R1 while the base electrode b1 is connected to the first voltage reference or supply network RW1 via a biasing resistor R2. It will be noted that the first voltage reference network RW1 includes a coupling capacitor C1 and a referencing diode D1. In practice, one plate of capacitor C1 is directly connected to input terminal T1 while the other plate of capacitor C1 is connected to the anode electrode of diode D1. The cathode electrode of diode D1 is connected to ground lead LG and ground lead TG. As shown, the upper ends of collector load resistor R1 and the base biasing resistor R2 are connected to the junction point formed between the other plate of capacitor C1 and the anode electrode of diode D1.

It will be seen that the collector electrode c2 is connected to the second voltage reference supply network RW2 via a load resistor R3 while the base electrode b2 is connected to the second voltage reference or supply network RW2 via a biasing resistor R4. Like reference or supply network RW1, the voltage reference network RW2 includes a coupling capacitor C2 and a referencing diode D2. As shown, one plate of coupling capacitor C2 is directly connected to input terminal T2 while the other plate of capacitor C2 is connected to the anode electrode or diode D2. The cathode electrode of diode D2 is connected to ground lead LG and ground terminal TG. It will be noted that the upper ends of collector load resistor R3 and base biasing resistor R4 are connected to the junction point formed between the other plate of capacitor C2 and the anode electrode of diode D2.

It will be appreciated that the cross-coupling is provided between the transistors Q1 and Q2 of the multivibrator by a pair of timing capacitors C3 and C4. That is, a first cross-coupling capacitor C3 couples the collector electrode c2 to the base electrode b1 while a second cross-coupling capacitor C4 couples the collector electrode c1 to the base electrode b2. Thus, the natural period of oscillation of the astable multivibrator, namely, the resonant frequency of the a.c. output signals, is determined by the R-C time constants of the circuit parameters. In practice, the value of timing capacitors C3 and C4 have been chosen so that the discharge time constants R2C3 and R4C4 are approximately one-tenth (1/10) of the value of the input R-C time constants of R1C1 and R3C2. In effect, the timing of the circuit is a function of the voltage applied across the coupling capacitors and the amount of current flowing through them.

The square-wave output signals produced by the multivibrator are derived from the collector electrode c2 of transistor Q2 and are coupled by capacitor C5 to a load (not shown) connected across terminal T3 and TG. In practice, the output signals developed across output terminals T3 and TG are amplified to drive or energize a suitable electromagnetic relay or the code rate detector of a vital decoder.

Turning now to the operation of the present invention, it will be assumed that the components or elements have been interconnected as shown and that the gate is intact and functioning properly so that the following occurs. Further, let us initially assume that either input pulse V1 or input pulse V2 or that both input pulses V1 and V2 do not presently appear on d.c. input terminals T1 and T2. Under this condition, the AND logic circuit 1 should not produce an a.c. output signal across the output terminals T3 and TG due to the lack of coincidence of the two d.c. inputs. Thus, the astable multivibrator RO remains dormant where either or both of the d.c. input pulses are absent due to the unavailability of operating and biasing potentials on either or both of the amplifying transistors Q1 and Q2. In viewing the drawing, it will be seen that at time $t_1$ a negative-going pulse is not present on either input terminal T1 or T2. Now, at time $t_2$, a negative-going pulse V1 appears on input terminal T1 so that a negative voltage is produced on the anode electrode of diode D1 so that appropriate biasing and operating potentials are applied to transistor Q1. However, no negative-going pulse appears on terminal T2 at time $t_2$ so that transistor Q2 remains in a dormant condition. Thus, the relaxation oscillator RO still does not go into oscillation due to the absence of necessary biasing and operating voltage on transistor Q2. Now, at time $t_3$, the negative-going pulse V1 remains on input terminal T1, and a negative-going pulse V1 appears on input terminal T2 so that biasing and operating potentials are applied to transistor Q2. Thus, with the appropriate biasing and operating potentials applied to transistors Q1 and Q2, one of the transistors will begin to conduct before the other due to the slight variations in the tolerances in the components. The one transistor conducts while the other transistor is cut off until a point is reached at which the two transistors reverse their conditions. That is, the one transistor which has been conducting cuts off, and the other transistor which was cut off conducts. The transistors Q1 and Q2 will alternately be rendered conductive and nonconductive so that high frequency a.c. signals or oscillations VO are developed on collector electrode c2 and are coupled through capacitor C5 to the load connected across output terminals T3 and TG. In viewing the drawing, it will be noted that the output oscillations are in reference to ground or zero voltage by the voltage reference networks. The a.c. oscillations will continue to be produced until time $t_4$ at which time both pulses V1 and V2 cease to exist. Thus, the coincidence or presence of both d.c. input pulses results in the production of a.c. output oscillations while the absence of either one or both of the d.c. input pulses results in the cessation of a.c. output oscillations. It will be seen that the output signal takes the form of a square-wave envelope encompassing high frequency oscillations. Further, the peak-to-peak value of the a.c. oscillations is equal to the amplitude of the negative-going input pulses.

As previously mentioned, the AND logic circuit 1 operates in a fail-safe manner in that no critical component or circuit failure is capable of simulating an output across terminals T3 and TG. It will be appreciated that an open circuited or short circuited condition either results in the destruction of the necessary amplifying characteristics or causes the removal of the essential biasing and/or operating potentials. Additionally, the timing, feedback or referencing features will be upset when certain failures occur in the circuit. Thus, a false output cannot be produced on output terminals to erroneously represent the coincidental appearance of the necessary two input pulses V1 and V2.

Accordingly, it can be seen that this unique AND gate produces a.c. oscillations across terminals T3 and TG when and only when the two negative-going pulses V1 and V2 are in coincidence and no critical component or circuit failure is present.

It is readily understood that NPN transistors may be used in place of the PNP transistors by employing positive-going input pulses and by reversing the polarity of the referencing diodes. It is also apparent that other amplifier configurations may be used in place of the common emitter configuration. It will be appreciated that while this invention finds particular utility in a vehicle speed control system, it is readily evident that the subject AND logic gate may be employed in other systems and equipment which require the security and safety inherent in the present invention. But regardless of the manner in which the invention is used, it is understood that various alterations may be made by persons skilled in the art without departing from the spirit and scope of this invention. It is also apparent that other modifications, changes and variations may be made to the presently described invention and, therefore, it is understood that all alterations, modifications and equivalents falling within the spirit and scope of the present invention are herein meant to be included in the appended claims.

Having now described the invention, what I claim as new and desire to secure by Letters Patent, is:

1. A fail-safe logic circuit comprising, a free-running multivibrator having a first and a second transistor, a first voltage reference network including a first coupling capacitor and a first zero voltage reference diode coupled to said first transistor, and a second voltage reference network including a second coupling capacitor and a second zero voltage reference diode coupled to said second transistor so that said free-running multivibrator produces a.c. oscillations when and only when said first voltage reference network supplies biasing and operating potentials to said first transistor and said second voltage reference network supplies biasing and operating potentials to said second transistor.

2. The fail-safe logic circuit, as defined in claim 1, said first and second transistors are arranged as a common emitter amplifier.

3. The fail-safe logic circuit , as defined in claim 1, wherein said free-running multivibrator is a common-emitter transistor circuit.

4. The fail-safe logic circuit, as defined in claim 1, wherein said first voltage reference network includes aid capacitor and said diode for referencing a negative voltage to ground.

5. The fail-safe logic circuit, as defined in claim 1, wherein said second voltage reference network includes said capacitor and said diode for referencing a negative voltage to ground.

6. The fail-safe logic circuit, as defined in claim 1, wherein a first resistor couples the collector electrode of said first transistor and said first voltage reference network, a second resistor couples the base electrode of said first transistor to said first voltage reference network, a third resistor couples the collector electrode to said second transistor to said second voltage reference network, and a fourth resistor couples the base electrode to said second transistor to said second voltage reference network.

7. The fail-safe logic circuit, as defined in claim 6, wherein a first capacitor cross-couples the collector electrode of said second transistor to the base electrode of said first transistor and a second capacitor cross-couples the collector electrode of said first transistor to the base electrode of said second transistor.

8. The fail-safe logic circuit, as defined in claim 6, wherein the emitter electrodes of said first and second transistors are connected to ground.

9. The fail-safe logic circuit, as defined in claim 1, wherein said first voltage reference network is connectable to a first source of signal pulses and said second voltage reference network is connectable to a second source of signal pulses.

* * * * *

UNITED STATES PATENT AND TRADEMARK OFFICE
CERTIFICATE OF CORRECTION

PATENT NO. : 4,320,315
DATED : March 16, 1982
INVENTOR(S) : John J. Kuhn

It is certified that error appears in the above-identified patent and that said Letters Patent are hereby corrected as shown below:

Column 6, line 27, change "aid" to --said-- line 35, delete "and" and insert --to-- line 38, delete "to" and insert --of-- line 41, delete "to", first occurrence, and insert --of--

Signed and Sealed this

Ninth Day of November 1982

(SEAL)

Attest:

GERALD J. MOSSINGHOFF

Attesting Officer     Commissioner of Patents and Trademarks